United States Patent
Dokumaci et al.

(10) Patent No.: US 6,586,289 B1
(45) Date of Patent: Jul. 1, 2003

(54) ANTI-SPACER STRUCTURE FOR IMPROVED GATE ACTIVATION

(75) Inventors: Omer H. Dokumaci, Wappingers Falls, NY (US); Bruce B. Doris, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/882,250

(22) Filed: Jun. 15, 2001

(51) Int. Cl.[7] .............. H01L 21/8238; H01L 21/8234; H01L 21/336; H01L 21/425; H01L 21/44

(52) U.S. Cl. ............. 438/199; 438/217; 438/275; 438/303; 438/532; 438/659

(58) Field of Search ............... 438/303, 229, 438/278, 232, 659, 296, 532, 275, 276, 277, 217, 199

(56) References Cited

U.S. PATENT DOCUMENTS

| | | | |
|---|---|---|---|
| 5,756,381 A | * 5/1998 | Buynoski | 438/199 |
| 5,770,494 A | * 6/1998 | Yamamoto et al. | 438/232 |
| 5,773,336 A | * 6/1998 | Gu | 438/199 |
| 5,821,146 A | * 10/1998 | Chang et al. | 438/299 |
| 5,827,761 A | * 10/1998 | Fulford, Jr. et al. | 438/199 |
| 5,834,347 A | * 11/1998 | Fukatsu et al. | 438/232 |
| 5,837,572 A | * 11/1998 | Gardner et al. | 438/199 |
| 5,976,925 A | * 11/1999 | Cheek et al. | 438/231 |
| 5,981,321 A | * 11/1999 | Chao | 438/199 |
| 6,054,354 A | * 4/2000 | Nowak et al. | 438/275 |
| 6,060,364 A | 5/2000 | Maszara et al. | |
| 6,110,818 A | 8/2000 | Haskell | |
| 6,365,523 B1 | 4/2002 | Jang et al. | |
| 6,368,988 B1 | 4/2002 | Li et al. | |
| 6,410,403 B1 | 6/2002 | Wu | |
| 6,482,698 B2 | * 11/2002 | Peschiaroli et al. | 438/257 |
| 6,500,705 B2 | * 12/2002 | Kumagai | 438/223 |
| 6,503,789 B1 | * 1/2003 | Kim et al. | 438/232 |

FOREIGN PATENT DOCUMENTS

| | | | |
|---|---|---|---|
| JP | 405315556 A | * | 11/1993 |
| JP | 405335410 A | * | 12/1993 |
| JP | 6-53507 | | 2/1994 |
| JP | 406163575 A | * | 6/1994 |
| JP | 406216324 A | * | 8/1994 |
| JP | 406334032 A | * | 12/1994 |
| JP | 09312397 A | | 2/1997 |

OTHER PUBLICATIONS

Abstract of Japanese Publication No. 6–53507, issued Feb. 25, 1994.
Abstract of Japanese Publication No. 09312397, issued Feb. 25, 1994.

* cited by examiner

*Primary Examiner*—Matthew Smith
*Assistant Examiner*—Chuong Luu

(57) ABSTRACT

A method and structure for improving the gate activation of metal oxide semiconductor field effect transistor (MOSFET) structures are provided. The method of the present invention includes the steps of forming a structure having a plurality of patterned gate stacks atop a layer of gate dielectric material; forming a non-conformal film on the structure including the plurality of patterned gate stacks; blocking some of the plurality of patterned gate stacks with a first resist, while leaving other patterned gate stacks of said plurality unblocked; implanting first ions into the unblocked patterned gate stacks; removing the first resist and blocking the previously unblocked patterned gate stacks with a second resist; implanting second ions into the patterned gate stacks that are not blocked by the second resist; and removing the second resist and the non-conformal film. The inventive structure contains a non-conformal film formed on both horizontal and vertical surfaces of a structure including at least non-predoped patterned gate regions.

22 Claims, 3 Drawing Sheets

ANTI-SPACER STRUCTURE FOR IMPROVED GATE ACTIVATION

RELATED APPLICATIONS

This application is related to U.S. Ser. No. 09/888,160 which is being concurrently filed with this application.

FIELD OF THE INVENTION

The present invention relates to semiconductor device manufacturing, and more particularly to a method of fabricating a metal oxide semiconductor field effect transistor (MOSFET) in which the gate and source/drain regions are independently doped in a self-aligned manner after the gate stack has been etched. The method of the present invention does not affect line width control, and no additional lithography steps are required.

BACKGROUND OF THE INVENTION

In today's most advanced semiconductor devices, the gate implant is also received by the source/drain regions. Typically, the maximum amount of dopant that the gate can receive is limited by the amount that the source/drain regions can tolerate. For example, current state-of-the-art NFETs use phosphorus for the source/drain regions. If too much phosphorus is implanted into the source/drain regions, then lateral phosphorus diffusion may be excessive causing degraded short channel effects. On the contrary, implanting high doses of phosphorus (on the order of about $5E15\ cm^{-2}$ or greater) into the gate reduces the gate depletion effect and improves the device characteristics.

In some prior art processes, wider source/drain spacers are used to accommodate a higher dose of phosphorus into the source/drain regions. However, this causes the series resistance of the transistor to significantly increase.

If arsenic is used for the source/drain doping, achieving comparable gate activation as phosphorus is difficult for the same thermal cycle. In order to achieve maximum flexibility in achieving the least poly depletion and best short channel effect control, independent doping of the source/drain regions and the gate regions is desirable.

It would thus be beneficial if a method would be developed that was capable of independent doping of the gate region and the source/drain regions. Such a method would achieve improvements in the gate region of the device without negatively impacting the source/drain regions of the device.

One possible prior art approach for independent doping of the gate and the source/drain regions includes the use of a so-called gate predoping scheme. A typical gate predoping scheme of the prior art includes the steps of:

(i) depositing polysilicon onto a surface of a gate dielectric which is formed atop a semiconductor substrate;

(ii) using a first lithographic step to block the PFET region;

(iii) implanting ions into the NFET polysilicon material;

(iv) stripping the resist employed in step (ii);

(v) using a second lithographic step to block the NFET region;

(vi) implanting ions into the PFET polysilicon material;

(vii) stripping of the resist; and (viii) etching the gate stack region.

In this prior art process, an activation annealing step is typically performed between steps (vii) and (viii) mentioned above.

A major disadvantage of this prior art integration scheme is that the implants are performed before the gate stack has been etched. This leads to poor line width control since the P-type polysilicon will etch differently than the N-type polysilicon. Also, if the implant condition is changed, the gate etch steps needs to be re-optimized again since a different doping in the gate region will change the etch characteristics. Another major disadvantage of the aforementioned prior art gate predoping scheme is that it requires two additional lithography steps, e.g., steps (ii) and (v) mentioned-above, prior to etching of the gate region. A yet further disadvantage of this prior art process is that the different etching rates may result in recessing a portion of the substrate.

In view of the above drawbacks with prior art methods, there is a continued need for providing a method which is capable of independent doping of the gate and the source/drain regions that will allow for optimizing the doping in the gate and source/drain regions independently so that improved device characteristics can be achieved without the compromise between gate depletion and series resistance.

SUMMARY OF THE INVENTION

One object of the present invention is to provide a method of fabricating a MOSFET device which is capable of independent doping of the gate and the source/drain regions.

A further object of the present invention is to provide a method of fabricating a MOSFET device which has reduced gate depletion, improved device characteristics and limited lateral diffusion of dopant in the source/drain regions as well as the source/drain extension regions.

Another object of the present invention is to provide a method of fabricating a MOSFET device which has improved series resistance and line width control.

A yet further object of the present invention is to provide a method of fabricating a MOSFET device in which gate predoping is avoided and the number of lithographic steps is reduced.

These and other objects and advantages are achieved in the present invention by utilizing an anti-spacer structure. The anti-spacer structure of the present invention enables independent doping of the gate and source/drain regions in a self-aligned manner after the gate stack etch so that line width control is not affected, and no additional lithography steps are required. The anti-spacer structure employs a thin film (or stack of films) having poor step coverage that is deposited on the etched gate stack either before or after the source/drain regions and/or extension implants are formed.

It is noted that the lack of step coverage of the inventive anti-spacer structure enables the source/drain regions and the source/drain extensions to be blocked during gate implanting, while the sidewalls of the gate are exposed and are thus able to be implanted at an angle. The film having a lack of step coverage is referred to herein as a non-conformal film. The non-conformal film (or stack of films) may be an organic or inorganic film which may be selectively removed after the gate is implanted. The non-conformal film is thick across horizontal surfaces present in the structure, yet the non-conformal film is thin across vertical surfaces present in the structure. In some embodiments, the non-conformal film is non-existent on the vertical surfaces, i.e., vertical gate region. The variation of thickness in the non-conformal film permits the selective doping of the gate region, while blocking the source/drain regions and source/drain extensions from the gate implant.

One aspect of the present invention thus relates to a method of fabricating a MOSFET device which comprises the steps of:

(a) forming a structure having a plurality of patterned gate stacks atop a layer of gate dielectric material;

(b) forming a non-conformal film on said structure including at least said plurality of patterned gate stacks;

(c) blocking some of the plurality of patterned gate stacks with a first resist, while leaving other patterned gate stacks of said plurality unblocked;

(d) implanting first ions into said unblocked patterned gate stacks;

(e) removing said first resist and blocking said previously unblocked patterned gate stacks with a second resist;

(f) implanting second ions into said patterned gate stacks that are not blocked by said second resist; and (g) removing said second resist and said non-conformal film.

Note that source/drain regions and source/drain extensions may be formed prior to performing step (b) above, after step (d) and step (f), or after step (g). When the source/drain regions and source/drain extensions are formed prior to performing step (b), it is necessary to form sidewall spacers on the vertical sidewalls of each patterned gate stack region. These spacers are then removed before conducting steps (b)–(g) of the present invention. In a preferred embodiment of the present invention, the source/drain extensions are formed before formation of the source/drain regions.

In the present invention, the first ions employed in step (d) may be the same or different from the second ions employed in step (f). In a preferred embodiment of the present invention, the first ions are different from the second ions. Note that in some embodiments, the ions used in steps (d) and (f) are the same, but different ion dosages are employed in each step so as to form doped gate regions having different ion concentrations.

In addition to providing a method of independent doping of the gate, source/drain regions and the source/drain extensions, the present invention also relates to a semiconductor structure, e.g., anti-spacer structure, which includes the non-conformal film thereon. Specifically, the inventive structure of the present invention, which is an intermediate structure for the final MOSFET-containing device, comprises:

a semiconductor substrate having a layer of gate dielectric material formed on a surface thereof;

a plurality of patterned gate regions formed on said layer of gate dielectric material, said plurality of patterned gate regions not being pre-doped; and a non-conformal film formed atop exposed surfaces of said substrate or said layer of gate dielectric and said plurality of patterned gate regions, wherein said non-conformal film is thicker over horizontal surfaces, while being thinner over vertical sidewalls of each of said patterned gate regions.

Note that in some embodiments of the present invention, the patterned gate regions include a reoxidation material formed thereon.

DETAILED DESCRIPTION OF THE INVENTION

Figure 1:
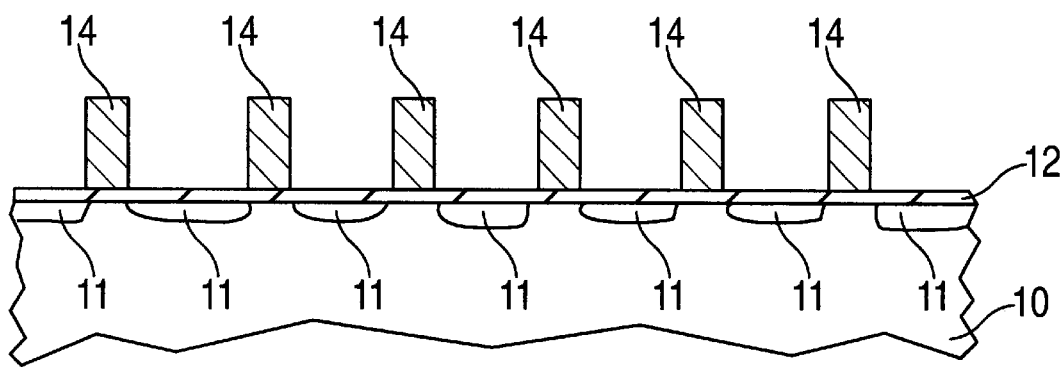
FIGS. 1–7 are pictorial representations (through cross-sectional views) showing the basic processing steps of the present invention.

The present invention, which provides a method of fabricating a MOSFET device in which independent doping of the gate, source/drain regions and source/drain extensions is achieved, will now be described in greater detail by referring to the drawings that accompany the present application. It is noted that in the accompanying drawings like and/or corresponding elements are referred to by like reference numerals.

Reference is first made to FIG. 1 which illustrates an initial structure that is employed in the present invention. Specifically, the initial structure shown in FIG. 1 comprises semiconductor substrate 10, a layer of gate dielectric 12 formed on a surface of semiconductor substrate 10, and a plurality of patterned gate stacks 14 formed on portions of gate dielectric 12.

The structure shown in FIG. 1 is comprised of conventional materials well know in the art and it is fabricated utilizing processing steps that are also well known in the art. For example, semiconductor substrate 10 comprises any semiconducting material including, but not limited to: Si, Ge, SiGe, GaAs, InAs, InP and all other III/V semiconductor compounds. Semiconductor substrate 10 may also include a layered substrate comprising the same or different semiconducting material, e.g., Si/Si or Si/SiGe, as well as a silicon-on-insulator (SOI) substrate. The substrate may be of the n- or p-type depending on the desired device to be fabricated.

Additionally, semiconductor substrate 10 may contain active device regions, wiring regions, isolation regions or other like regions that are typically present in MOSFET-containing devices. For clarity, these regions are not shown in the drawings, but are nevertheless meant to be included within region 10. In one highly preferred embodiment of the present invention, semiconductor substrate 10 is comprised of Si.

Next, a layer of gate dielectric material such as an oxide, nitride, oxynitride or any combination and multilayer thereof, is then formed on a surface of semiconductor substrate 10 utilizing a conventional process well known in the art. For example, the layer of gate dielectric material may be formed by utilizing a conventional deposition process such as chemical vapor deposition (CVD), plasma-assisted CVD, evaporation or chemical solution deposition, or alternatively, the gate dielectric material may be formed by a thermal growing process such as oxidation, nitridation or oxynitridation.

The thickness of the layer of gate dielectric material formed at this point of the present invention is not critical to the present invention, but typically, gate dielectric 12 has a thickness of from about 1 to about 20 nm after deposition, with a thickness of from about 1.5 to about 10 nm being more highly preferred. It is noted that the gate dielectric material employed in the present invention may be a conventional dielectric material such as $SiO_2$ or $Si_3N_4$, or alternatively, high-k dielectrics such as oxides of Ta, Zr, Hf, Al or combinations thereof may be employed. In one highly preferred embodiment of the present invention, gate dielectric 12 is comprised of an oxide such as $SiO_2$, $ZrO_2$, $Ta_2O_5$, $HfO_2$ or $Al_2O_3$.

After forming gate dielectric 12 on a surface of semiconductor substrate 10, a plurality of patterned gate regions 14 are formed atop the layer of gate dielectric. The patterned gate regions are formed utilizing a conventional process which includes the steps of: depositing at least a gate material, and patterning said gate material via lithography and etching. The lithography step includes applying a photoresist to the gate material, exposing the photoresist to a pattern of radiation and developing the pattern utilizing a conventional developer solution. Etching is performed utilizing a conventional dry etching process such as reactive-ion etching, plasma etching, ion beam etching or laser ablation. Following the etching process, the photoresist is removed from the structure utilizing a conventional stripping process well known in the art so as to provide the structure shown, for example, in FIG. 1.

In one embodiment of the present invention, the gate dielectric is patterned at this point of the inventive process and the non-conformal film is subsequently formed on exposed surfaces of the substrate as well as vertical sidewalls of the patterned gate stack region, including the patterned gate dielectric.

It is noted that each of patterned gate regions 14 shown in FIG. 1 includes at least a gate material which may further contain an optional dielectric capping layer formed thereon. The term "gate material" as used herein denotes a conductive material, a material that can be made conductive via a subsequent process such as ion implantation, or any combination thereof. Illustrative examples of suitable gate materials that can be employed in the present invention include, but are not limited to: polysilicon, amorphous silicon, elemental metals such as W, Pt, Pd, Ru, Rh and Ir, alloys of these elemental metals, silicides or nitrides of these elemental metals, and combinations thereof, e.g., a gate stack including a layer of polysilicon and a layer of conductive metal. A highly preferred gate material employed in the present invention is a gate material that is comprised of polysilicon or amorphous silicon.

The gate material is formed on the surface of gate dielectric 12 utilizing conventional deposition processes well known in the art including, but not limited to: CVD, plasma-assisted CVD, evaporation, plating, or chemical solution deposition. When metal silicides are employed, a conventional silicide process may be used in forming the silicide layer. One such silicide process that can be used in the present invention includes the steps of: first forming an elemental metal, annealing the elemental metal so as to form a metal silicide layer therefrom, and removing any unreacted elemental metal utilizing a conventional wet etch process that has a high selectivity for removing unreacted metal as compared to silicide.

It is noted that in embodiments wherein a gate stack is employed, e.g., a stack of polysilicon and elemental metal, an optional diffusion barrier (not shown in the drawings) may be formed between each layer of the gate stack. The optional diffusion barrier, which is formed utilizing conventional deposition processes such as those mentioned hereinabove, is comprised of a material such as SiN, TaN, TaSiN, WN, TiN and other like materials which can prevent diffusion of a conductive material therethrough.

As stated above, an optional dielectric capping layer may be present atop the gate material. When present, the optional dielectric capping layer is comprised of an oxide, nitride or oxynitride and it is formed utilizing a conventional deposition process such as, for example, CVD or plasma-assisted CVD. Alternatively, a conventional thermal growing process such as, for example, oxidation, may be used in forming the optional dielectric capping layer.

In one embodiment of the present invention, source/drain diffusion regions 11 and source/drain extensions (note that the source/drain extensions are not shown separately in the drawings; instead they are meant to be included within region 11) may be formed in the semiconductor substrate at this point of the present invention. Typically, the source/drain extensions are formed prior to the deep source/drain regions utilizing conventional ion implantation and annealing processes well known in the art. In the embodiment shown, disposable sidewall spacers (not shown) would be formed on the vertical sidewalls of each patterned gate region utilizing deposition and etching processes well known in the art. After formation of the source/drain extension regions and source/drain diffusion regions, the disposable spacers are removed utilizing a conventional etching process well known to those skilled in the art.

In other embodiments, the source/drain diffusion regions and source/drain extension regions may be formed after implanting into each gate region or following implantation into both gate regions. A gate activation anneal, as mentioned hereinbelow, may follow the implantation into the gate region. Note that in FIG. 1 the source/drain diffusion regions and source/drain extensions are shown therein.

In yet another embodiment of the present invention, the patterned gate stack is subjected to a conventional reoxidation process prior to forming the non-conformal film on the structure.

Figure 2:
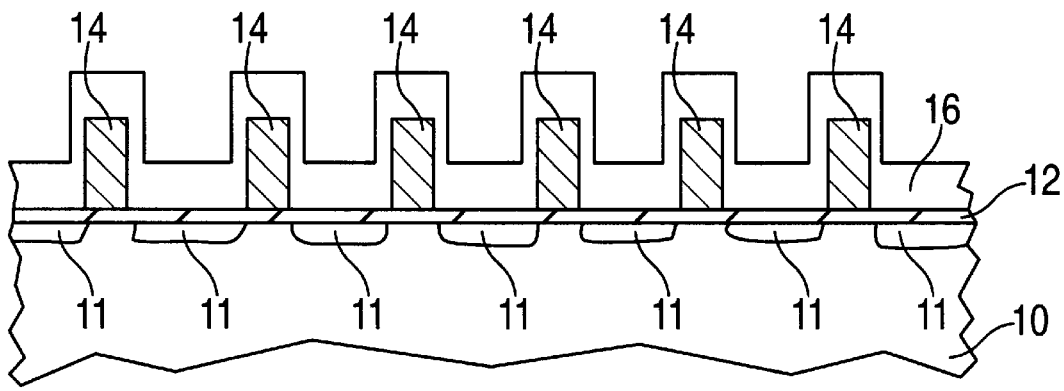

After providing the structure shown in FIG. 1, non-conformal film 16 is formed across the entire surface of the structure including atop gate dielectric 12 and patterned gate regions 14 (note both the horizontal and vertical sidewalls of the patterned gate regions contain the non-conformal film). The resultant structure including non-conformal film 16 is shown, for example, in FIG. 2. It is noted that the term "non-conformal film" is used in the present invention to denote a film that is thicker on the horizontal surfaces of the gate material and the gate dielectric, and thinner on the vertical surfaces of the gate material, or optionally the material formed by reoxidation. In some embodiments, the non-conformal film may be non-existent on the vertical surfaces of the gate material. In the embodiment wherein the gate dielectric is patterned, non-conformal film 16 is formed on exposed surfaces of the substrate as well as the patterned regions (including patterned gate dielectric and patterned gate stack). As stated previously, the variation in thickness of the non-conformal film allows for blocking of the source/drain diffusion regions during the doping of the gate material through the sidewalls thereof.

The non-conformal film is formed in the present invention utilizing any deposition process that is capable of forming such a layer or multilayer thereof on a structure. Following the deposition of the non-conformal film, an isotropic etching process such as a dry or wet etch process that is capable of uniformly removing the non-conformal film, yet is selective to the gate material, substrate, and optional liner (to be discussed hereinbelow) may be used to thin the film by the same amount on both the vertical and horizontal surfaces. This process of deposition and etching may be repeated any number of times, as required. Alternatively, the non-conformal film may be formed utilizing a conformal deposition process and thereafter a lateral etching process may be used in forming the non-conformal film on the structure.

Non-conformal film 16 employed in the present invention may be comprised of a dielectric material, such as an oxide, nitride or oxynitride, which is different from the gate dielectric. Different dielectric materials are required in the present invention so as to provide the necessary etch selectivity needed for removing the non-conformal layer in a subsequent etching step. Alternatively, the non-conformal film may be comprised of a photoresist material or another organic, or inorganic film which may be selectively removed following the gate implanting steps.

In one embodiment of the present invention, an optional liner that is thin and conformal may be formed on the structure prior to formation of the non-conformal film. The optional liner (not shown in the drawings) is comprised of an insulating material such as $Si_3N_4$ or $SiO_2$. Note that optional liner assists in the subsequent removal of the non-conformal film.

Figure 3:
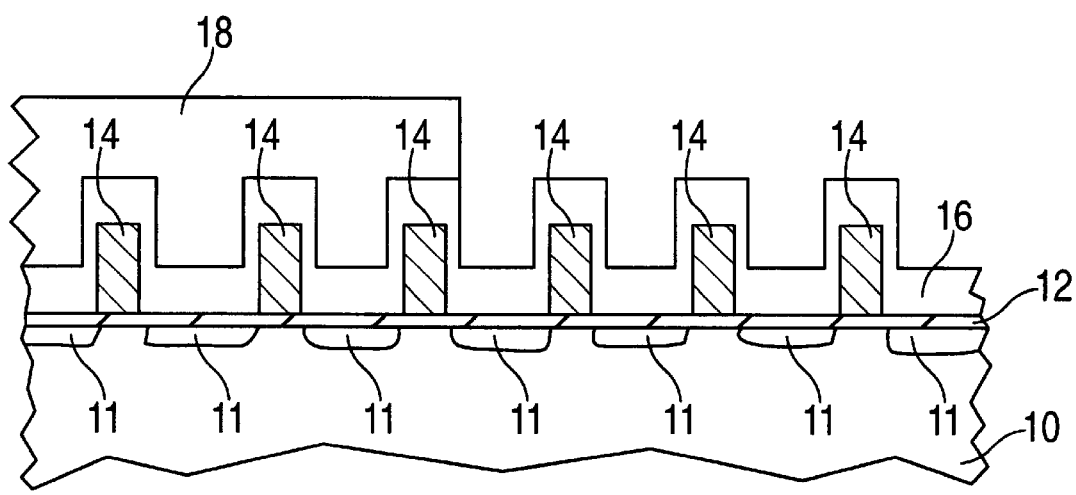

FIG. 3 shows the structure that is obtained after some of patterned gate stacks 14 are blocked with first resist 18, while leaving other patterned gate stacks unblocked. Specifically, the structure shown in FIG. 3 is formed utilizing conventional lithography which includes the steps of: applying a layer of first resist 18, exposing the layer of first resist to a pattern of radiation and developing the pattern utilizing a conventional resist developer.

Figure 4:
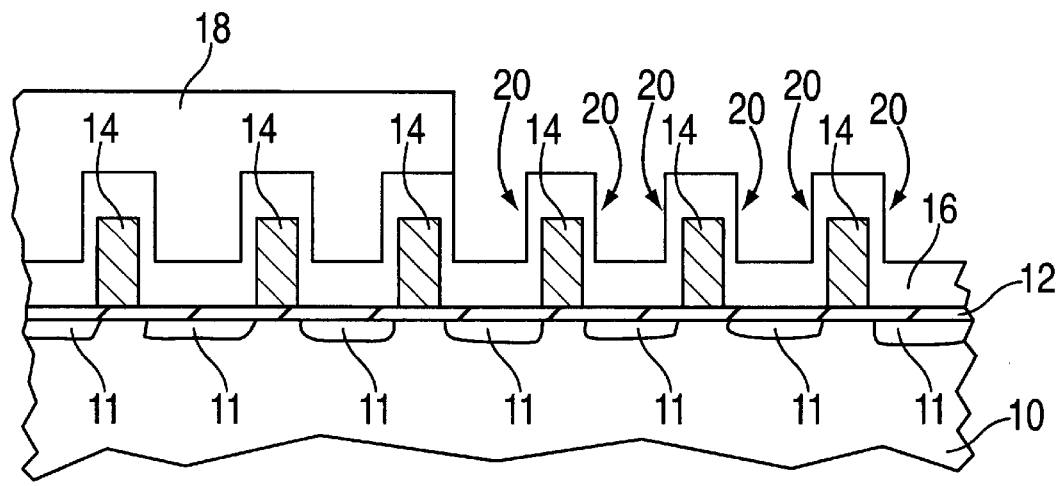

With first resist 18 in place, the unblocked patterned gate stacks are then subjected to an ion implantation step which is capable of implanting ions into the exposed gate regions that are not blocked with first resist 18. In accordance with the present invention, this ion implantation step includes the use of an angled ion implant wherein an ion of a first conductivity type (N or P) or neutral is implanted into the gate material. The ion dose used in this implant step of the present invention may vary, but typically an ion dose of about $5E15\ cm^{-2}$ or greater is employed. This step of the present invention, i.e., the first angled ion implantation step, is shown in FIG. 4. Note that in the drawing reference numeral 20 is used to denote the first ions (first conductivity type or neutral) that are being implanted within the gate material.

It is noted that the ions implanted at this step of the present invention are not implanted into the substrate due to the presence of the thicker horizontal portions of non-conformal film 16. Instead, the ions are implanted into the gate region through the thinner vertical portion of the non-conformal film 16.

In an optional embodiment of the present invention, the gate material is preamorphized prior to implanting the first ions into the gate material. When preamorphization occurs an ion such as Ge or Si is implanted into the gate material. The preamorphization step is employed in the present invention to prevent channeling of the first ions into the channel region of the device.

In some embodiments of the present invention, the unblocked non-conformal film shown in FIG. 4 may be removed at this point of the inventive method and source/drain extensions and source/drain diffusion regions 11 may be formed into the surface of substrate 10 as described hereinabove. This embodiment is not shown in the drawings since the source/drain extensions and source/drain diffusion regions have been previously formed into the surface of substrate 10. Note that when such an embodiment is performed, no additional lithographic masking layers are necessary.

Figure 5:
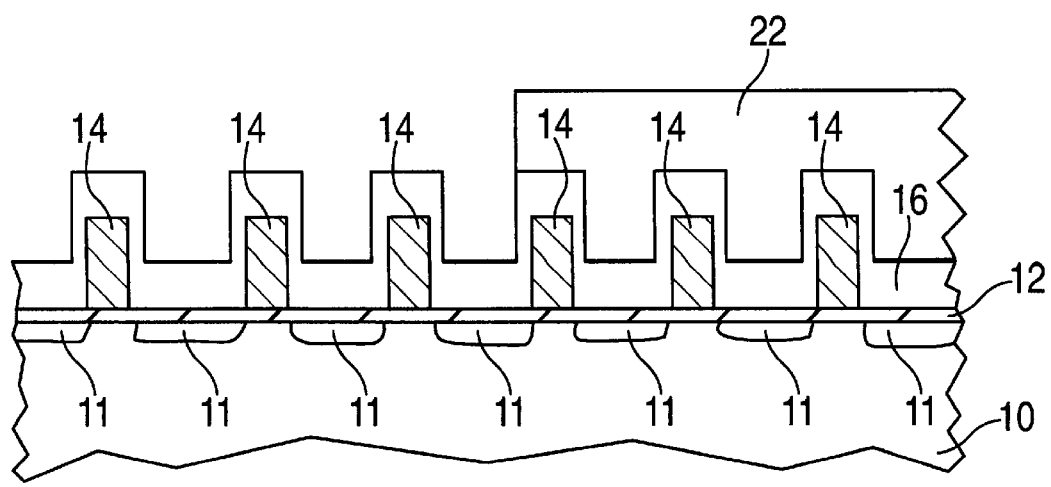

After the unblocked portions of the patterned gate regions have been subjected to ion implantation, first resist 18 is removed from the structure utilizing a conventional stripping process well known in the art and patterned second resist 22 is formed atop the previously ion implanted gate regions providing the structure shown in FIG. 5. The patterned second resist is formed utilizing conventional lithography.

Figure 6:
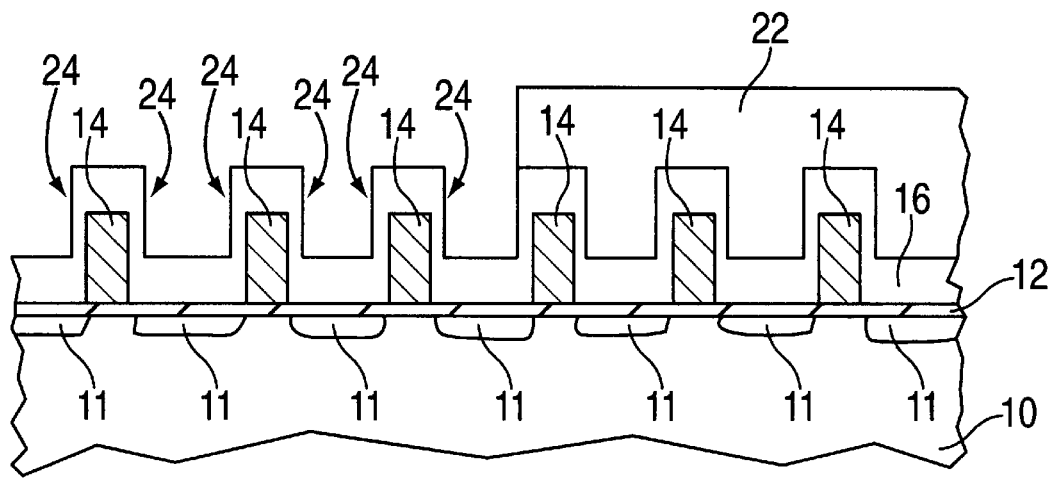

FIG. 6 shows the structure during a second angled ion implant step wherein second ions (second conductivity type (N or P) or neutral) that are the same or different from the first ions are implanted into the gate region. In a preferred embodiment, different conductivity ions are employed. Note that reference numeral 24 denotes the second ions that are implanted into the gate region at this point of the present invention. The ion dose used in this implant step may vary, but typically an ion dose of about $5E15\ cm^{-2}$ or greater is employed. A preamorphization as mentioned herein above may be employed prior to this implantation step.

In some embodiments of the present invention, the unblocked non-conformal film shown in FIG. 6 may be removed and source/drain extensions and source/drain diffusion regions 11 may be formed into the surface of substrate 10 as described hereinabove. This embodiment is not shown in the drawings since those regions have been previously formed into the surface of substrate 10.

Figure 7:
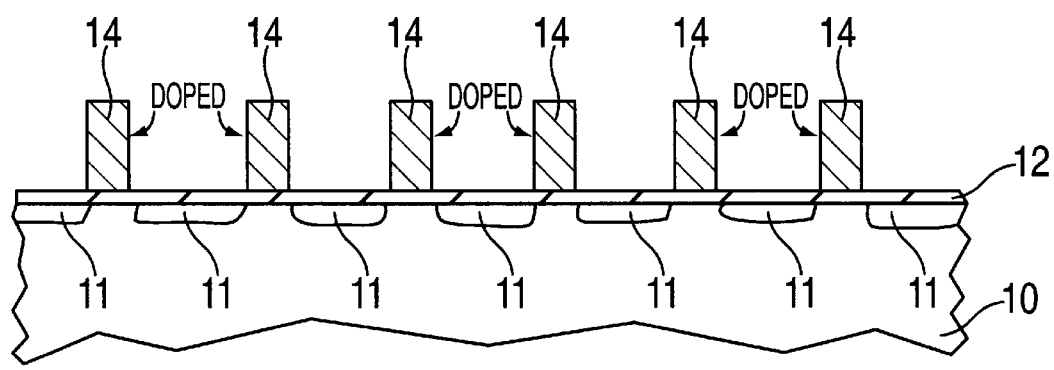

Next, and as shown in FIG. 7, second resist 22 is removed utilizing a conventional stripping process well known in the art and thereafter, and if not previously done, non-conformal film 16 is removed from the entire structure utilizing a conventional etching process that is highly selective in removing the non-conformal film.

It should be noted that after each of the above-mentioned angled implants, the gate regions may be activated utilizing a conventional activation annealing process that is well known to those skilled in the art. Note that the gate regions may be annealed separately after implanting each gate region, or the gate regions may be annealed at the same time. Typical annealing conditions that may be used in the present invention for activating the gate regions include an annealing temperature of about 900° C. or greater and an annealing time of about 15 seconds or less. Other annealing times and annealing temperatures can also be employed. The activation annealing step is typically carried out in $N_2$, an inert gas such as He or Ar, or mixtures thereof.

In some embodiments of the present invention, the activation of the gate regions occurs in a single step prior to completely removing non-conformal film 16 from the structure. In another embodiment of the present invention, the activating of the gate regions may be performed after removing the non-conformal film from the structure. In such an embodiment, the source/drain diffusion regions and extension implants may be formed after the complete removal of the non-conformal film, but prior to activating the gate regions.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating a metal oxide semiconductor field effect transistor (MOSFET) device comprising the steps of:
    (a) forming a structure having a plurality of patterned gate stacks atop a layer of gate dielectric material;
    (b) forming a non-conformal film on said structure including at least said plurality of patterned gate stacks;
    (c) blocking some of the plurality of patterned gate stacks with a first resist, while leaving other patterned gate stacks of said plurality unblocked;
    (d) implanting first ions into said unblocked patterned gate stacks;
    (e) removing said first resist and blocking said previously unblocked patterned gate stacks with a second resist;

(f) implanting second ions into said patterned gate stacks that are not blocked by said second resist; and (g) removing said second resist and said non-conformal film.

2. The method of claim 1 wherein step (a) comprising the steps of: forming at least one gate material on said gate dielectric and patterning said gate material via lithography and etching.

3. The method of claim 2 wherein said at least one gate material comprises a conductive material or a material that can be made conductive.

4. The method of claim 2 wherein said at least one gate material is selected from the group consisting of polysilicon, amorphous silicon, an elemental metal or alloys thereof, a silicide or nitride of an elemental metal and any combination thereof.

5. The method of claim 4 wherein said elemental metal is W, Pt, Pd, Ru, Rh or Ir.

6. The method of claim 2 wherein said at least one gate material is comprised of polysilicon or amorphous silicon.

7. The method of claim 1 wherein said non-conformal film is formed by a non-conformal deposition process, a non-conformal deposition process and isotropic etching, or a conformal deposition process and lateral etching.

8. The method of claim 1 wherein said non-conformal film is thicker over horizontal surfaces as compared with vertical surfaces.

9. The method of claim 1 wherein said non-conformal film is comprised of an organic film, an oxide, a nitride or an oxynitride.

10. The method of claim 1 wherein said first resist is formed via lithography.

11. The method of claim 1 wherein said first ions are comprised of a N-type dopant.

12. The method of claim 1 wherein step (d) is performed utilizing an angled ion implantation process.

13. The method of claim 1 wherein step (d) is performed utilizing an ion dose of about 5E15 $cm^{-2}$ or greater.

14. The method of claim 1 wherein said second resist is formed via lithography.

15. The method of claim 1 wherein said second ions are comprised of a P-type dopant.

16. The method of claim 1 wherein step (f) is performed utilizing an angled ion implantation process.

17. The method of claim 1 wherein step (f) is performed utilizing an ion dose of about 5E15 $cm^{-2}$ or greater.

18. The method of claim 1 wherein source/drain extension regions and source/drain diffusion regions are formed in a surface of a semiconductor substrate which is present beneath said gate dielectric prior to performing step (b).

19. The method of claim 1 wherein source/drain extension regions and source/drain diffusion regions are formed in a surface of a semiconductor substrate which is present beneath said gate dielectric following implant steps (d) and (f).

20. The method of claim 1 wherein source/drain extension regions and source/drain diffusion regions are formed in a surface of a semiconductor substrate that is present beneath said gate dielectric after performing step (g).

21. The method of claim 1 wherein said implanted patterned gate stacks are activated after steps (d) or (e) using separate activation annealing steps.

22. The method of claim 1 wherein said implanted patterned gate stacks are activated using a single activation annealing step after said removal of said second resist or after said removal of said non-conformal film.

* * * * *